METHOD OF PRODUCING SOFT SOLDERABLE CONTACTS FOR INSTALLING SEMICONDUCTOR COMPONENTS INTO HOUSINGS

Filed June 30, 1971

3,761,309

METHOD OF PRODUCING SOFT SOLDERABLE CONTACTS FOR INSTALLING SEMICONDUCTOR COMPONENTS INTO HOUSINGS

Detlev Schmitter and Hans Ullrich, Munich, and Rudolf Wölfle, Gilching, Germany, assignors to Siemens Aktiengesellschaft, Berlin, Munich and Erlangen, Germany Filed June 30, 1971, Ser. No. 158,458
Claims priority, application Germany, July 2, 1970, P 20 32 872.7
Int. Cl. B44d 1/02
U.S. Cl. 117—212 6 Claims

ABSTRACT OF THE DISCLOSURE

The invention relates to a method for producing soft solderable contacts for the installation of semiconductor components into housings. The device containing the semiconductor component is first provided with a metallization of aluminum-titanium-gold. Thereafter, elevated gold contacts are produced through galvanic reinforcement. Finally, a coating of a solderable metal, particularly of nickel, is precipitated without current. The invention is particularly suitable for the installation of integrated circuits, into housings.

Figure 1:
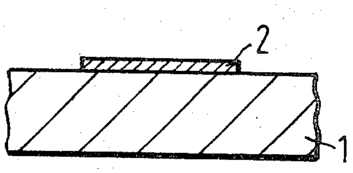

The invention relates to a method for production soft solderable metal contacts for installing semiconductor components, particularly semiconductor circuits produced according to the planar technique, into housings. To this end, the so-called "face-down" method is used. Thus, the device which contains the semiconductor component is contacted with its front side that contains the component regions downward upon a substrate of insulating material.

It is an object of the present invention to produce, using a simple method and technology, reliable soft solderable metal contacts on semiconductor components and semiconductor circuits, which contacts are suitable for use in soldering technique as employed in the facet-down soldering method.

Up until now it was necessary to use complicated methods whose metallizations and metal layer sequences had not been sufficiently tested. The contacting with the substrate was frequently done by thermo-compression or nail-head bonding. Another possibility is the beam lead technique which, however, entails instabilities. A method known for contacting multipole, integrated circuits called "face-down" bonding employs contact bumps or lumps whose metallurgical construction is such that they only partly melt during the contacting of the printed circuit portion. These bumps are produced so that a copper sphere is placed into a lead tin solder, with the aid of an appropriate metal mask and alloyed into said solder, upon the place of the semiconductor device to be contacted and provided with a metallization comprising a plurality of metal sequences.

The present invention provides another method for producing metal contacts using bumps. The method hereof provides a certain simplification and other improvements with respect to the known methods.

The invention is characterized by a method wherein the device which contains the semiconductor component is first provided in a known manner with an aluminum conductor path structure. The entire device is then coated with an $SiO_2$ layer and a portion of the aluminum structure is exposed by the known photo etching technique. A titanium metal layer, followed by a gold metal layer, are precipitated thereon. Following a further photo varnish or resist process, the last applied gold contact metal layer is galvanically reinforced at the localities provided for the application of the soft solderable metal contacts. Subsequently, the solderable coating in form of a metal which is resistant to gold with respect to its solubility, is precipitated by currentless wet chemistry.

It is within the frame work of the invention to use as the solderable coating, a nickel layer which is first precipitated from a boron containing nickel bath and thereafter from a phosphorus containing nickel bath.

This new method helps to make the contact terminals which were previously produced only for thermo-compression or ultrasonic soldering methods suitable for use in solder technology such as the facet down solder technique, for example, through the currentless application of a solderable coating which is neither diffused into the carrier material nor dissolved by the solder during the soldering process.

The advantages derived therefrom are:

(1) High operational reliability of the components thus produced;

(2) The structural component arrangements provided for the "flip-chip" contacting technique, may be used just as readily for the "face-down" solder technique and, hence, for hybrid circuits;

(3) A very simple production method without additional masks and without complicated manufacturing methods;

(4) Low production costs;

(5) Easy to exchange component devices through soft soldering method; and (6) Due to contact bumps (gold bumps) with further tolerable elevations, no absolutely planar substrate is required, while the positioning and the thermal conditions need also not be adhered to, too strictly, during the soldering process.

A further feature of the present invention is to apply in addition to the nickel layer, another soft solderable layer, which is done by immersion. Particularly favorable appears to be a layer of tin, of lead-tin, of lead-silver-indium alloy.

According to the invention, the layer thickness of the nickel layer is to be adjusted to approximately 1.5 $\mu$m.

The nickel layer is preferably precipitated under the action of ultrasonics.

Specific details and other advantages of the invention are further illustrated in the embodiment example with reference to the drawing, wherein:

FIGS. 1 to 8 show the production process of a semiconductor according to the method of the invention provided with a soft solderable contact.

For the sake of better clarity, the illustration of the variably doped zones in the semiconductor body are omitted and only the application of the metal layer necessary for contacting is described.

FIG. 1 shows part of a silicon wafer provided with a plurality of semiconductor components or semiconductor circuits. Only one region of such a silicon crystal wafer 1, provided with an aluminum conductor path structure 2, is shown in section. The aluminum conductor path structures were vapor deposited through masks and produced at a layer thickness of 1 $\mu$m.

Figure 2:
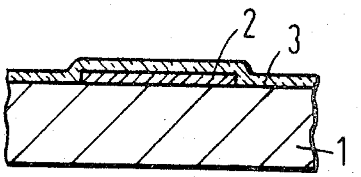

Prior to the ensuing metallization process, an approximately 1$\mu$ thick $SiO_2$ layer 3 was applied by high frequency cathodic vaporization or sputtering across the conductor path system 2 to give the device according to FIG. 2.

Figure 3:
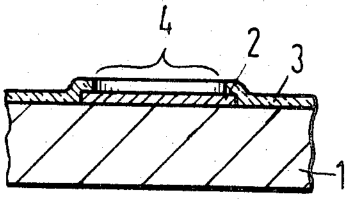

A window 4 was then etched by the known photo varnish technique in the region of the $SiO_2$ layer 3 to expose partially the Al conductance path structure 2. This is seen in FIG. 3.

Figure 4:
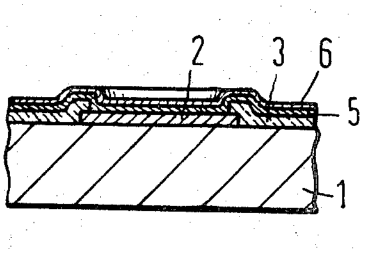
Figure 5:
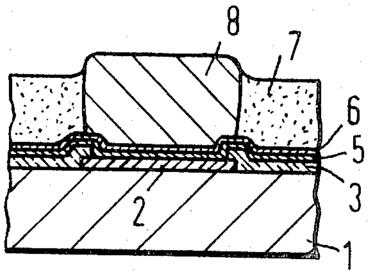
Figure 6:
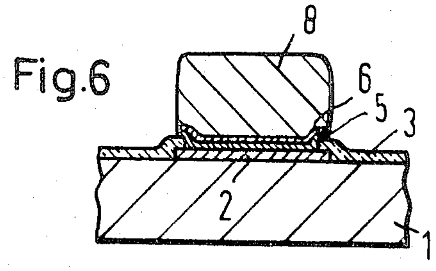

FIG. 4 shows the total precipitation of a layer of titanium 5 at a layer thickness of 0.2 $\mu$m. and a layer of gold 6 at the same thickness. This total area precipitation is effected through vapor deposition of the pure metals.

Thereafter, a photo varnish layer 7 was deposited with a window in which gold lumps, bumps or platforms were produced by a simple, galvanic gold reinforcement. The gold bumps 8 were thereby produced with a height of about 15 μm.

Subsequently thereto, the photo varnish layer 7 was removed and a structural etching of the total area gold and titanium layers was effected with suitable solvents. The gold bumps serving as an etching mask, to this end. The device shown in FIG. 6 resulted therefrom and is already suitable for contacting according to the flip-chip technique, through thermocompression or nail head bonding.

Figure 7:
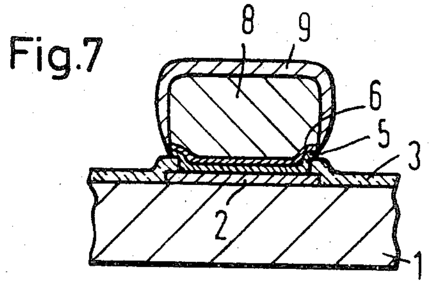

In order to use this contact, for a face down soldering method which has considerable previously discussed advantages compared to the known solder techniques, the entire device is subjected to a wet chemical currentless metal precipitation process. This takes place, for example, after cleaning in acetone, by placing the device shown in section in FIG. 6, first into a boron containing nickel bath and thereafter into a phosphorus containing nickel bath, and coating the device under the influence of ultrasonics and heat, with the nickel layer 9, as shown in FIG. 7. The first nickel bath consists of an ammonical nickel sulfate solution which contains additions of sodium borohydride, sodium borate and ammonium hydrogen citrate. The second nickel bath comprises an ammonical nickel chloride solution which contains additions of ammonium chloride, sodium hypophosphite and ammonium hydrogencitrate. The nickel plating lasted about 10 minutes, until a nickel layer of approximately 1.5 μm. thickness had grown.

Since, during currentless nickel plating, the nickel precipitates only on metals, all places coated with $SiO_2$ layer 3 remain free of nickel. This is only the connections or bumps 8 of gold, coated with a nickel layer.

Due to the fact that at a soldering temperature of at most 350° C., nickel will neither diffuse into gold nor considerably dissolve in the solder (e.g. tin or lead for contacting the insulating substrate) it acts as a solderable protective layer for the gold against attack from the solder.

The layer sequence aluminum titanium gold has been tested and will not change through the additional nickel plating.

Figure 8:
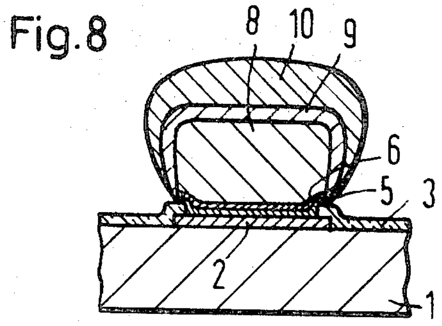

For special requirements, the device, which in FIG. 7 is coated with a nickel layer 9, may also be coated with an additional solderable layer, such as tin. FIG. 8 shows such a device which after the application of the nickel layer 9, had a tin layer 10 applied through immersion tin plating. Other tin alloys or lead-containing solders may also be used in place of tin.

The semiconductor devices produced according to the method of the present invention are most suitable for producing integrated circuits with the hybrid technique, as well as for installation in DIP (dual-inline-plastic) housings. The previously mentioned requirements which have to be placed upon these components are very well met.

What is claimed is:

1. A method of producing soft solderable metal contacts for installing semiconductor components into housings by the so-called face-down soldering method wherein the device containing the semiconductor component is contacted, with its front side that contains the component regions, downward, upon a substrate of insulated material, which comprises providing a device which contains a semiconductor component with an conductor path structure of aluminum, coating the entire device with a $SiO_2$ layer, exposing a portion of the aluminum structures by the photo resist technique, depositing sequentially a titanium layer and then a gold layer over the entire surface, limiting the exposed areas of the gold layer to the places provided for the application of the soft solderable metal contacts by a photo resist step, reinforcing galvanically the exposed areas of the gold layer with additional gold, wet chemically precipitating a nickel layer as a solderable coating, resistant to gold with respect to its solubility, upon the reinforced gold layer, said nickel layer being first precipitated from a boron containing nickel bath and then from a phosphorus containing nickel bath, and thereafter using an immersion process to apply a soft solder layer selected from the group consisting of lead-tin, lead and lead-silver-indium.

2. The method of claim 1, wherein the nickel layer is precipitated in a thickness of approximately 1.5μ.

3. The method of claim 2, wherein the precipitation of the nickel layer is effected under the influence of ultrasonics.

4. The method of claim 1, wherein the aluminum layer is precipitated in thickness of 1μ, the titanium layer and gold layers in a thickness of 0.2μ and the galvanically reinforced gold layer is precipitated in a thickness of 15μ.

5. The method of claim 4, wherein the $SiO_2$ layer is applied through cathode sputtering in a layer thickness of 1 μm.

6. A semiconductor component produced by the method of claim 1.

References Cited

UNITED STATES PATENTS

| | | | |
|---|---|---|---|
| 3,585,461 | 6/1971 | Eynon et al. | 29—589 X |
| 3,472,751 | 10/1969 | King | 204—192 |
| 3,535,773 | 10/1970 | Bakker et al. | 317—234 M |
| 3,362,851 | 1/1968 | Dunster | 317—234 M |
| 3,476,984 | 11/1969 | Tibel | 317—235 UA |

OTHER REFERENCES

Steinberg, E. B.: Ultrasonics in Industry, Proceedings of the I.E.E.E., vol. 53, No. 10, October 1965, p. 1292.

McBride et al.: Activating . . . With Sodium Borohydride Prior to Electroless Plating, IBM Tech. Discl., vol. 13, No. 3, August 1970.

EDWARD G. WHITBY, Primary Examiner

U.S. Cl. X.R.

29—576, 589; 117—217, 221, 227; 204—192; 317—234 J, 239 M, 235 UA